US007679536B2

(12) United States Patent
Chen et al.

(10) Patent No.: US 7,679,536 B2
(45) Date of Patent: Mar. 16, 2010

(54) METHOD AND APPARATUS FOR CONSTRUCTING EFFICIENT SLEPIAN-WOLF CODES WITH MISMATCHED DECODING

(75) Inventors: Jun Chen, Ossining, NY (US); Dake He, Yorktown Heights, NY (US); Ashish Jagmohan, Irvington, NY (US)

(73) Assignee: International Business Machines Corporation, Armonk, NY (US)

( * ) Notice: Subject to any disclaimer, the term of this patent is extended or adjusted under 35 U.S.C. 154(b) by 401 days.

(21) Appl. No.: 11/782,249

(22) Filed: Jul. 24, 2007

(65) Prior Publication Data

US 2009/0030922 A1 Jan. 29, 2009

(51) Int. Cl.
*H03M 7/30* (2006.01)
(52) U.S. Cl. .......................................... 341/107; 341/51
(58) Field of Classification Search .................. 341/51, 341/107
See application file for complete search history.

(56) References Cited

U.S. PATENT DOCUMENTS

| 2008/0189073 | A1* | 8/2008 | Jagmohan et al. ............ 702/181 |
| 2008/0279281 | A1* | 11/2008 | Draper et al. ........... 375/240.22 |
| 2008/0291065 | A1* | 11/2008 | Lu et al. ..................... 341/107 |
| 2009/0228757 | A1* | 9/2009 | Nishi ........................ 714/752 |

OTHER PUBLICATIONS

S. S. Pradhan and K. Ramchandran, "Distributed source coding using syndromes (DISCUS): design and construction", IEEE Transactions on Information Theory, pp. 626-643, Mar. 2003.
J. Garcia-Frais and Y. Zhao, "Compression of correlated binary sources using turbo codes", IEEE Communication Letters, 5:417-419, Oct. 2001.

V. Stankovic, A. Liveris, Z. Xiong, and C. Georghiades, "On code design for the general Slepian-Wolf problem and for lossless multiterminal communications networks", IEEE Transactions on Information Theory, pp. 1495-1507, Apr. 2006.
J. Bajcsy and P. Mitran, "Coding for the Slepian-Wolf problem with turbo codes", IEEE Globecom. pp. 1400-1404, Nov. 2001.
A. Aaron and B. Girod, "Compression with side information using turbo codes", Proceedings of the IEEE Data Compression Conference (DCC), pp. 252-261, Apr. 2002.
A. D. Liveris et al., "Compression of binary sources with side information at the decoder using LDPC codes", IEEE Communication Letters, vol. 6, pp. 440-442, 2002.
J. Chen, D. He and A. Jagmohan, "Slepain-Wolf code design via source-channel correspondence", Proceedings of IEEE International Symposium on Information Theory, Jul. 2006.
D. Schonberg, S. Draper, R. Puri and K. Ramchandran, "Slepain-Wolf codes for parallel sources: design and error-exponent analysis", Proceedings of the 44th annual Allerton Conference, Monticello, IL, Sep. 2005.

* cited by examiner

*Primary Examiner*—Howard Williams
(74) *Attorney, Agent, or Firm*—Whitham, Curtis, Christofferson & Cook, P.C.; Brian P. Verminski

(57) ABSTRACT

Disclosed is a method for constructing Slepian-Wolf codes, wherein the designed Slepian-Wolf codes are robust to mismatched decoding. The disclosed method for constructing Slepian-Wolf codes includes the steps of: choosing representative probability distributions from a set of possible probability distributions; choosing a probability distribution as a decoding metric; converting the chosen decoding metric to a cyclic-symmetric channel; computing the initial message value given the cyclic-symmetric channel; computing a set of probability distributions of the initial message given the initial message values and the representative probability distributions; optimizing the degree distribution given the set of probability distributions of the initial message; optimizing the decoding metric.

20 Claims, 4 Drawing Sheets

US 7,679,536 B2

METHOD AND APPARATUS FOR CONSTRUCTING EFFICIENT SLEPIAN-WOLF CODES WITH MISMATCHED DECODING

BACKGROUND OF THE INVENTION

1. Field of the Invention

The present application generally relates to methods and apparatuses for construction of codes for data-compression and, more particularly, to a method and apparatus for constructing efficient Slepian-Wolf codes for mismatched coding.

2. Background Description

Slepian-Wolf codes refer to codes used for compressing source data at an encoder, where the decoder has access to side information not available to the encoder. There are many applications of these codes. Examples of such applications include, but are not limited to, low complexity encoding of media, distributed source coding for sensor networks, scalable video coding, etc.

FIG. 1 shows a generic Slepian-Wolf coding system. The signal $X^n = X_1 X_2 \ldots X_n$, termed the Slepian-Wolf source 100, is compressed by the encoder 101 using a Slepian-Wolf code, the output of which is a set of symbols termed syndromes 102. These syndromes represent the compressed source signal. The decoder 103 receives a signal $Y^n = Y_1 Y_2 \ldots Y_n$, termed the Slepian-Wolf side information 104, which is used to decode the signal $X^n$ from the syndromes. Without loss of generality, it can be assumed that $X_i$ and $Y_i$ take values in discrete sets $\{0, 1, \ldots, M-1\}$ and $\{0, 1, \ldots, N-1\}$, respectively, for all $i = 1, 2, \ldots, n$. The efficiency of compression (measured by the bit rate of the syndromes required to decode X successfully) depends, among other factors, on the joint distribution of $X_i$ and $Y_i$ (denoted by $P_{XY}$), the goodness of the Slepian-Wolf code employed, and the decoding method. The better the Slepian-Wolf code, the lower is the number of syndrome bit required for successful decoding for a given joint distribution and a decoding method.

Previous methods for designing Slepian-Wolf code are reported by S. S. Pradhan and K. Ramchandran, "Distributed source coding using syndromes (DISCUS): design and construction", *IEEE Transactions on Information Theory*, pp. 626-643, March 2003, J. Garcia-Frais and Y. Zhao, "Compression of correlated binary sources using turbo codes", *IEEE Communication Letters*, 5:417-419, October 2001, V. Stankovic, A. Liveris, Z. Xiong, and C. Georghiades, "On code design for the general Slepian-Wolf problem and for lossless multiterminal communications networks", *IEEE Transactions on Information Theory*, pp. 1495-1507, April 2006, J. Bajcsy and P. Mitran, "Coding for the Slepian-Wolf problem with turbo codes", *IEEE Globecom.* pp. 1400-1404, November 2001, A. Aaron and B. Girod, "Compression with side information using turbo codes", *Proceedings of the IEEE Data Compression Conference (DCC)*, pp. 252-261, April 2002, A. D. Liveris et al., "Compression of binary sources with side information at the decoder using LDPC codes", *IEEE Communication Letters*, vol. 6, pp. 440-442, 2002, J. Chen, D. He and A. Jagmohan, "Slepain-Wolf code design via source-channel correspondence", *Proceedings of IEEE International Symposium on Information Theory*, July 2006. These methods are developed under the assumption that the joint distribution $P_{XY}$ is perfectly known and the decoder uses a decoding metric that is matched to $P_{XY}$.

FIG. 2 shows an exemplary conventional method for constructing Slepian-Wolf codes. The input 200 to the design method is the probability distribution $P_{XY}$. The joint distribution 200 is first converted to a cyclic-symmetric channel distribution 201, i.e., $Q_{V|U}$, with input alphabet $\{0, 1, \ldots, M-1\}$ and output alphabet $\{0, 1, \ldots, M-1\} \times \{0, 1, \ldots, N-1\}$. The channel $Q_{V|U}$ is related to $P_{XY}$ through the equation $V = (U +_M X, Y)$, where U is independent of (X,Y) whose distribution is $P_{XY}$, and $+_M$ denotes modulo-M addition. The cyclic-symmetric channel $Q_{V|U}$ is then used to compute the initial message value 202, i.e., $m_0(v)$, through the equation:

$$m_0(v) = \left[\log \frac{Q_{V|U}(v|1)}{Q_{V|U}(v|0)}, \log \frac{Q_{V|U}(v|2)}{Q_{V|U}(v|0)}, \ldots, \log \frac{Q_{V|U}(v|M-1)}{Q_{V|U}(v|0)}\right],$$

$$v \in \{01, \ldots, M-1\} \times \{0, 1, \ldots, N-$$

The initial message value $m_0(v)$ and the probability distribution $P_{XY}$ are used to determine the probability distribution of $m_0(V)$, i.e., $P_{m_0}$ 203 by setting the probability distribution of V equal to $P_{XY}$. Given $P_{m_0}$, the density evolution means 204, which consists of the density evolution algorithm and the standard degree distribution optimization methods, outputs an optimized degree distribution 205. The construction of Slepian-Wolf codes given the degree distribution is straightforward.

However, for real applications, it is impossible to obtain a completely accurate estimation of the joint probability distribution $P_{XY}$. Let $\hat{P}_{XY}$ denote the estimated probability distribution that is used by the decoder to recover the source signal $X^n$ given the syndromes and the side information $Y^n$. For the case in which $\hat{P}_{XY}$ is different from $P_{XY}$, the decoder is mismatched to the true probability distribution (and therefore, the decoding is referred to as mismatched decoding). For practical Slepian-Wolf coding systems, it is essential that the imperfect knowledge of $P_{XY}$ is taken into account when designing Slepian-Wolf codes. It is also important to choose the optimal decoding metric in the mismatched decoding case, where the decoding metric is the joint probability distribution used for decoding. However, there are no previously known computationally feasible methods for constructing good Slepian-Wolf codes with mismatched decoding and choosing the optimum decoding metric.

Therefore, a need exists for an improved method for Slepian-Wolf code design wherein mismatched decoding resulting from the imperfect knowledge of joint probability distribution is taken into account. There also exists a need for an improved method for choosing the optimal decoding metric in the mismatched decoding case.

SUMMARY OF THE INVENTION

It is an object of this invention to improve methods for constructing efficient Slepian-Wolf codes with mismatched decoding.

Another object of the present invention is to provide a method for choosing the optimal decoding metric when the true probability distribution is not completely known.

These and other objectives are attained with a new method for designing Slepian-Wolf codes. The method includes the steps of: choosing representative probability distributions from a given set of possible probability distributions; computing a set of initial message probability distributions given the representative probability distributions and a fixed decoding metric; using density evolution to obtain an optimized degree distribution given a set of initial message probability distributions; optimizing the decoding metric so that the resulting degree distribution yields the lowest syndrome bit rate.

The preferred embodiment of the invention provides a method for constructing Slepian-Wolf codes with mismatched decoding. It allows the design of efficient and robust Slepian-Wolf codes for a prescribed set of probability distributions and a fixed decoding metric. The preferred embodiment of the invention also provides a method for choosing the optimal decoding metric when the true probability distribution is not completely known.

The key advantage of the present invention is that it can be used to construct Slepian-Wolf codes that are robust to mismatched decoding.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Embodiments of the present invention disclosed herein are intended to be illustrative only, since numerous modifications and variations of these embodiments will be apparent to those of ordinary skill in the art. In reference to the drawings, like numbers will indicate like parts continuously throughout the views.

Figure 1:
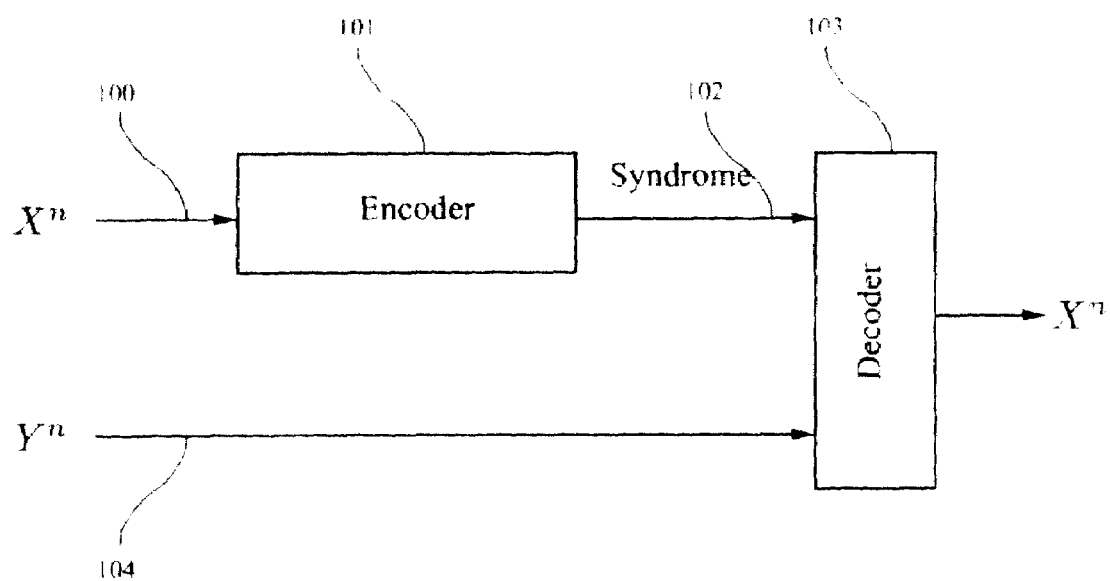
FIG. 1 is a block diagram illustrating the Slepian-Wolf coding method.
Figure 2:
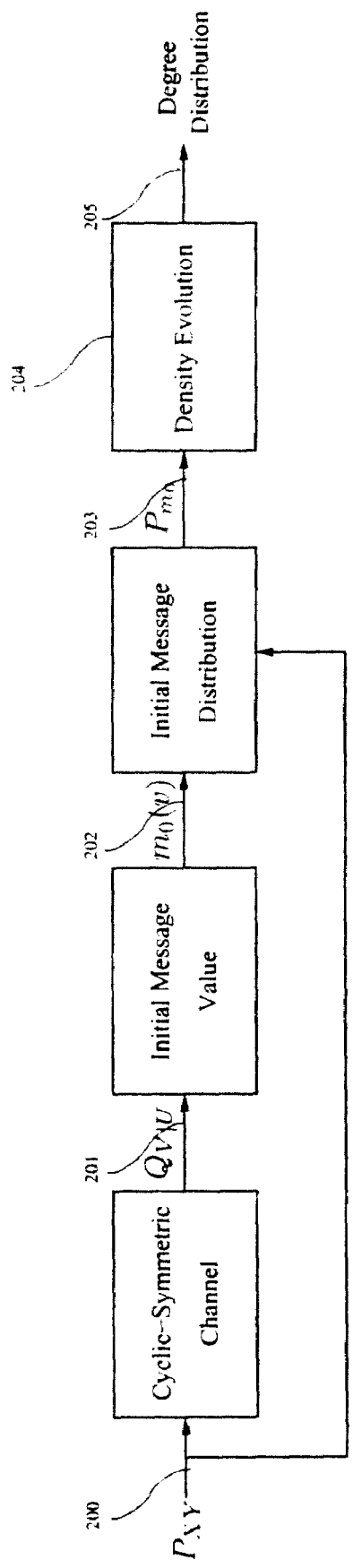
FIG. 2 is a block diagram illustrating a conventional Slepian-Wolf code design system.
Figure 3:
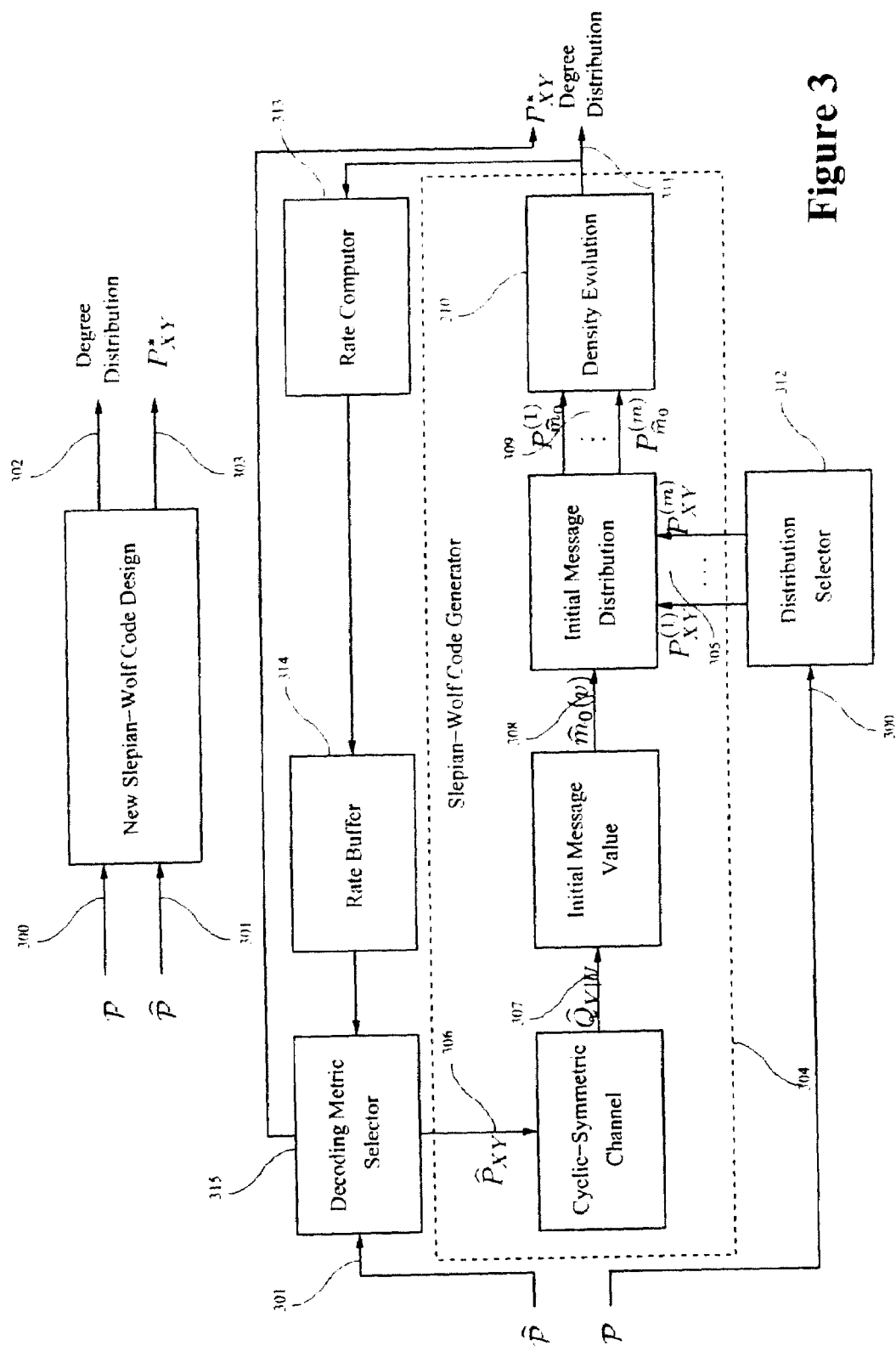
FIG. 3 is a block diagram illustrating an embodiment of the present invention for constructing Slepian-Wolf codes with mismatched decoding.

FIG. 3 depicts an exemplary embodiment of an apparatus which implements the method for constructing efficient Slepian-Wolf codes with mismatched decoding and choosing the optimal decoding metric. The inputs consist of a set of possible probability distributions 300, i.e., P, and a decoding metric set 301, i.e., $\hat{P}$. The output consists of a degree distribution 302 and a decoding metric 303, i.e. $P_{XY}^*$.

The key component of the method is a Slepian-Wolf code generator 304 for mismatched decoding with two inputs: a set of representative probability distributions 305 (e.g., $P_{XY}^{(1)}$, $P_{XY}^{(2)}, \ldots, P_{XY}^{(m)}$) from P and a tentative decoding metric $\hat{P}_{XY}$ 306 from the decoding metric set $\hat{P}$. The decoding metric $\hat{P}_{XY}$ is first converted to a cyclic-symmetric channel 307, i.e., $\hat{Q}_{V|U}$, with input alphabet $\{0, 1, \ldots, M-1\}$ and output alphabet $\{0, 1, \ldots, M-1\} \times \{0, 1, \ldots, N-1\}$. The channel $\hat{Q}_{V|U}$ is determined by $\hat{P}_{XY}$ through the equation $V=(U+_M X, Y)$, where U is independent of (X,Y) whose distribution is $\hat{P}_{XY}$, and $+_M$ denotes modulo-M addition. The cyclic-symmetric channel $\hat{Q}_{V|U}$ is then used to compute the initial message value 308, i.e., $\hat{m}_0(v)$, through the equation:

$$\hat{m}_0(v) = \left[\log\frac{\hat{Q}_{V|U}(v|1)}{\hat{Q}_{V|U}(v|0)}, \log\frac{\hat{Q}_{V|U}(v|2)}{\hat{Q}_{V|U}(v|0)}, \ldots, \log\frac{\hat{Q}_{V|U}(v|M-1)}{\hat{Q}_{V|U}(v|0)}\right],$$

$$v \in \{01, \ldots, M-1\} \times \{0, 1, \ldots, N-$$

The initial message value $\hat{m}_0(v)$ and the probability distribution $P_{XY}^{(i)}$ are used to determine the probability distribution of $\hat{m}_0(V)$, i.e., $P_{m_0}^{(i)}$ (output 309) by setting the probability distribution of V equal to $P_{XY}^{(i)}$ (i=1, 2, ..., m). Given $P_{m_0}^{(1)}$, $P_{m_0}^{(2)}, \ldots, P_{m_0}^{(m)}$, the density evolution means 310, which consists of the density evolution algorithm and the standard degree distribution optimization methods, outputs an optimized degree distribution 311 such that the decoding error probability for every initial message distribution $P_{m_0}^{(i)}$ (i=1, 2, ..., m) converges to zero under density evolution.

The representative probability distributions are chosen from P by a distribution selector 312. Only a few illustrative selection methods will be given here, since numerous modifications and variations will be straightforward to those of ordinary skill in the art. In the case where P is characterized by some parameters, the set of representative distributions can be chosen by sampling the parameters. For example, if P is a set of probability distributions $\{P^{(\lambda)}\}$ parameterized by $\lambda$ with $\lambda$ between 0 and 1, then $P^{(1)}$ and $P^{(2)}$ may be chosen as the representative probability distributions for P. In general, the number of representative probability distributions depends on the desired level of accuracy as well as the computational complexity constraints. In the case where P is a finite set, the set of representative probability distributions could be P itself.

The rate of degree distribution 311 outputted from the Slepian-Wolf code generator 304 is calculated using a rate computer 313, and is stored in a rate buffer 314.

The decoding metric set $\hat{P}$ could be different from P. The size of $\hat{P}$ can be chosen according to the computational complexity constraint. The tentative decoding metric $\hat{P}_{XY}$ is chosen from $\hat{P}$ by a decoding metric selector 315. The selection can be based on the rates in the rate buffer. In the case where $\hat{P}$ is a finite set, the decoding metric selector can use exhaustive search to optimize over $\hat{P}_{XY}$ so that the resulting degree distribution yields the lowest syndrome bit rate. The decoding metric selector can also use gradient search. Modified selection rules based on other search methods are obvious to those of ordinary skill in the art.

Finally, the optimum $\hat{P}_{XY}$ is output as the decoding metric 303, i.e., $P_{XY}^*$, and the associated degree distribution 302. The construction of Slepian-Wolf codes given the degree distribution is straightforward to those of ordinary skill in the art.

Figure 4:
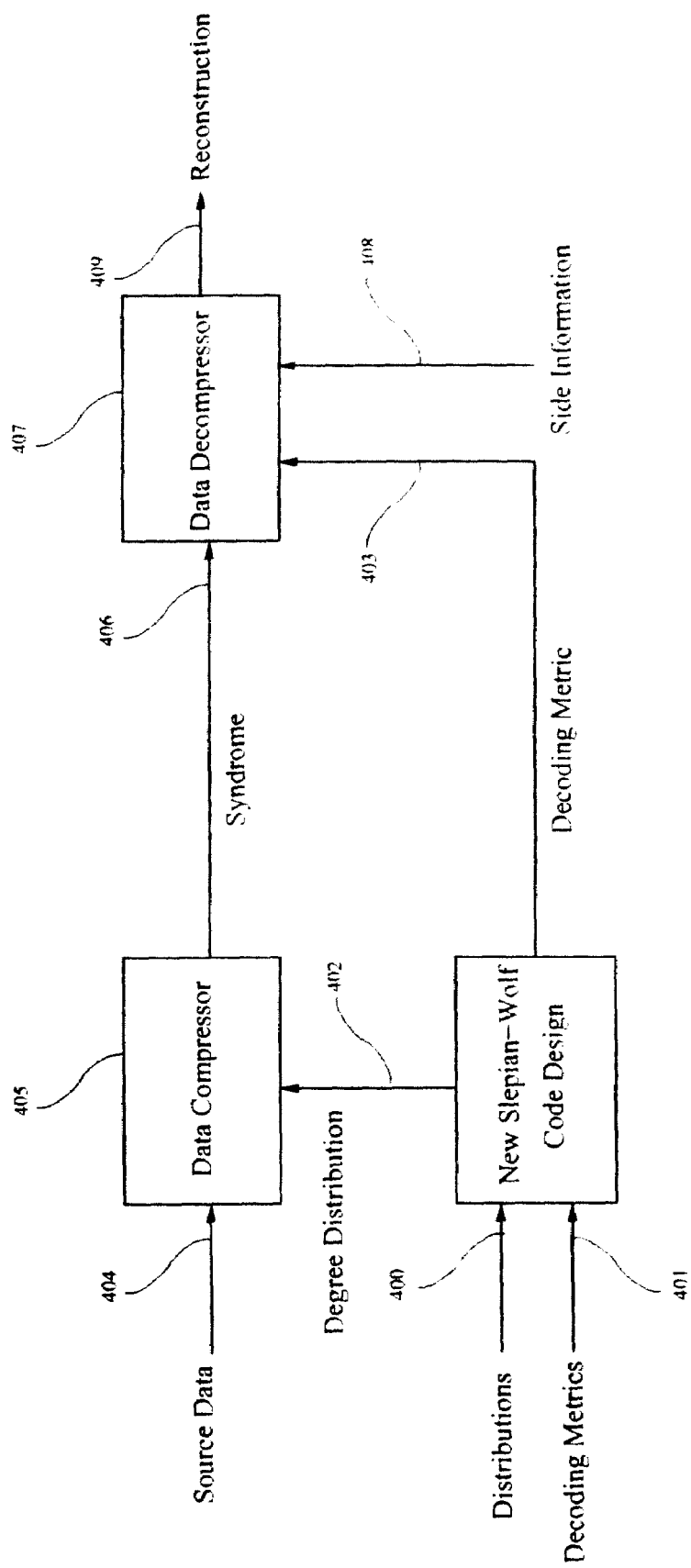
FIG. 4 is a block diagram illustrating a data compress and decompression system based on the present invention.

FIG. 4 shows an exemplary embodiment of a Slepian-Wolf data compression and decompression system using the presented invention. Given a set of possible probability distributions 400 and a set of decoding metrics 401, the presented new Slepian-Wolf code design outputs a degree distribution 402 and a decoding metric 403. The data compressor 405 encodes the source data 404 using the degree distribution 402 (more precisely, the data compressor 405 encodes the source data 404 using the Slepian-Wolf code induced by the degree distribution 402) and sends the syndrome 406 to the data decompressor 407. The data decompressor 407 reconstructs the data source 409 using the syndrome 406, the decoding metric 403 and the side information 408.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for data compression comprising the steps of:
   constructing a Slepian-Wolf code with one or more inputs
      wherein mismatched decoding resulting from imperfect knowledge of joint probability distribution is taken into account;

encoding a source data using the said Slepian-Wolf code to output a syndrome data; and decoding the source data from the syndrome data and a side information data by choosing an optimal decoding metric for the mismatched decoding.

2. The method for data compression according to claim 1, further comprising the step of selecting the decoding metric as the output decoding metric of the step of constructing the Slepian-Wolf code.

3. A method for constructing Slepian-Wolf codes with one or more inputs, wherein mismatched decoding resulting from imperfect knowledge of joint probability distribution is taken into account, comprising the steps of:
   a) choosing a tentative decoding metric from one of the inputs;
   b) selecting representative probability distributions from one of the inputs;
   c) converting the chosen decoding metric to a cyclic-symmetric channel;
   d) computing a set of probability distributions of the initial message given the initial message value and the representative probability distributions;
   e) optimizing the degree distribution given the set of probability distributions of the initial message; and
   f) generating a Slepian-Wolf code according to the said degree of distribution.

4. The method according to claim 3, wherein the inputs include a set of probability distributions and optionally a set of decoding metrics.

5. The method according to claim 4, wherein the said set of possible probability distribution is obtained through prior experiments.

6. The method according to claim 5, wherein the said prior experiments include estimating the parameters of probability distributions from a parametric class.

7. The method according to claim 4, wherein the said set of possible decoding metrics is obtained through prior experiments.

8. The method according to claim 7, wherein the said prior experiments include estimating the parameters of probability distributions from a parametric class.

9. The method according to claim 3, further comprising the steps of:
   g) calculating a rate of said degree distribution in step e) and storing the rate in a rate buffer;
   h) selecting a new decoding metric from one of the inputs given the stored rates in said rate buffer; and
   i) repeating steps b) through g) until a prescribed stopping criterion is met.

10. The method according to claim 9, wherein the outputs include a degree distribution and optionally a decoding metric.

11. The method described in claim 9 wherein the said prescribed stopping criterion is the absolute difference between two successive rates of said degree distribution calculated in step e is less than a given threshold.

12. The method according to claim 10, wherein the said degree distribution is the degree distribution of low-density parity-check codes.

13. The method according to claim 9, wherein the said decoding metric is optimized so that the resulting degree distribution yields the lowest syndrome bit rate.

14. The method according to claim 13, wherein the selection in step g) is done by exhaustive search for a finite set of decoding metrics.

15. The method according to claim 13, wherein the selection in step g) is done using gradient search.

16. The method according to claim 3, wherein for a fixed decoding metric, the said degree distribution is optimized by using density evolution and/or other standard channel code design tools.

17. The method according to claim 3, wherein the set of representative probability distributions is the same as the set of a finite set of possible probability distributions.

18. The method according to claim 3, wherein the set of representative probability distributions is selected by sampling the parameters of the set of possible probability distributions which is characterized by some parameters.

19. An encoding apparatus for source data which constructs Slepian-Wolf codes with two inputs and two outputs comprising:
   input means for receiving a tentative chosen decoding metric belonging to a given decoding metric set;
   selection means for selecting representative probability distributions from a set of possible probability distributions;
   conversion means for converting the chosen decoding metric to a cyclic-symmetric channel;
   computation means for computing a set of probability distributions of an initial message value of the source data and the representative probability distributions;
   optimization means for optimizing a degree distribution given a set of probability distributions of the initial message; and
   an encoder for encoding a source data using Slepian-Wolf code induced by the degree distribution to output a syndrome in a data compression system.

20. The encoding apparatus according to claim 19, further comprising:
   output means for outputting a decoding metric; and
   data decompression means receiving side information and said decoding metric for reconstructing the data source from the syndrome.

* * * * *